United States Patent
Ghannouchi et al.

(10) Patent No.: US 12,149,273 B2
(45) Date of Patent: Nov. 19, 2024

(54) SYSTEM AND METHOD FOR A FREQUENCY SELECTIVE RECEIVER

(71) Applicant: Fadhel M Ghannouchi, Calgary (CA)

(72) Inventors: Fadhel M Ghannouchi, Calgary (CA); Abul Hasan, Calgary (CA); Mohamed Helaoui, Calgary (CA)

(*) Notice: Subject to any disclaimer, the term of this patent is extended or adjusted under 35 U.S.C. 154(b) by 65 days.

(21) Appl. No.: 18/120,961

(22) Filed: Mar. 13, 2023

(65) Prior Publication Data
US 2023/0327694 A1    Oct. 12, 2023

Related U.S. Application Data

(63) Continuation of application No. 16/498,413, filed as application No. PCT/CA2018/050406 on Apr. 3, 2018, now Pat. No. 11,750,233.

(60) Provisional application No. 62/480,237, filed on Mar. 31, 2017.

(51) Int. Cl.
*H04B 1/12* (2006.01)

(52) U.S. Cl.
CPC .................................... *H04B 1/123* (2013.01)

(58) Field of Classification Search
CPC ........ H04B 1/123; H04B 1/28; H03H 19/002; Y02D 30/70
See application file for complete search history.

(56) References Cited

U.S. PATENT DOCUMENTS

| | | | | | |
|---|---|---|---|---|---|
| 5,265,269 | A | * | 11/1993 | Staudinger | H03D 7/1408 455/333 |
| 7,809,349 | B1 | * | 10/2010 | Granger-Jones | H04B 1/28 455/307 |
| 8,121,577 | B1 | * | 2/2012 | McKay | H04B 1/109 455/302 |
| 8,180,310 | B2 | * | 5/2012 | Vazny | H04B 1/18 455/24 |
| 2008/0125061 | A1 | * | 5/2008 | Kuriyama | H03F 3/24 455/127.1 |
| 2010/0261442 | A1 | * | 10/2010 | Paculdo | H04B 1/0458 455/110 |
| 2011/0281541 | A1 | * | 11/2011 | Borremans | H04B 1/18 455/307 |

* cited by examiner

*Primary Examiner* — Ankur Jain

(57) ABSTRACT

A receiver comprising a signal phase shifting block generating concurrent phase shifted copies of an input signal, and an impedance translation function block configured to receive the phase shifted copies of the input signal and generate a down converted signal wherein the impedance translation function block is driven by a single clock signal of frequency determined by a desired carrier frequency. The receiver including an energy harvesting block coupled to the phase shifting block to receive one or more in-band or out-of-band interferers in the input signal and reflected signals from the impedance translation function block due to nonlinearities.

19 Claims, 14 Drawing Sheets

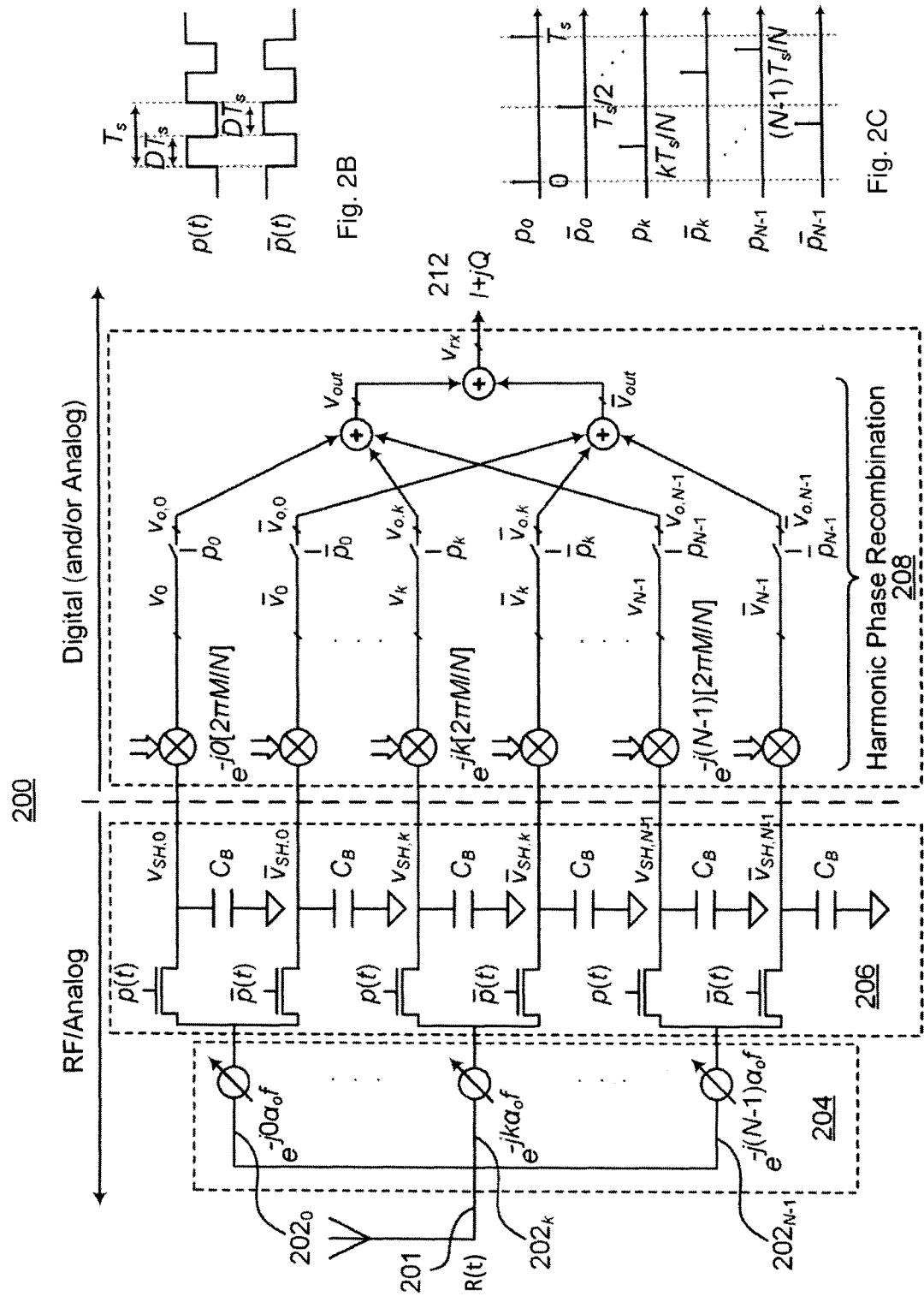

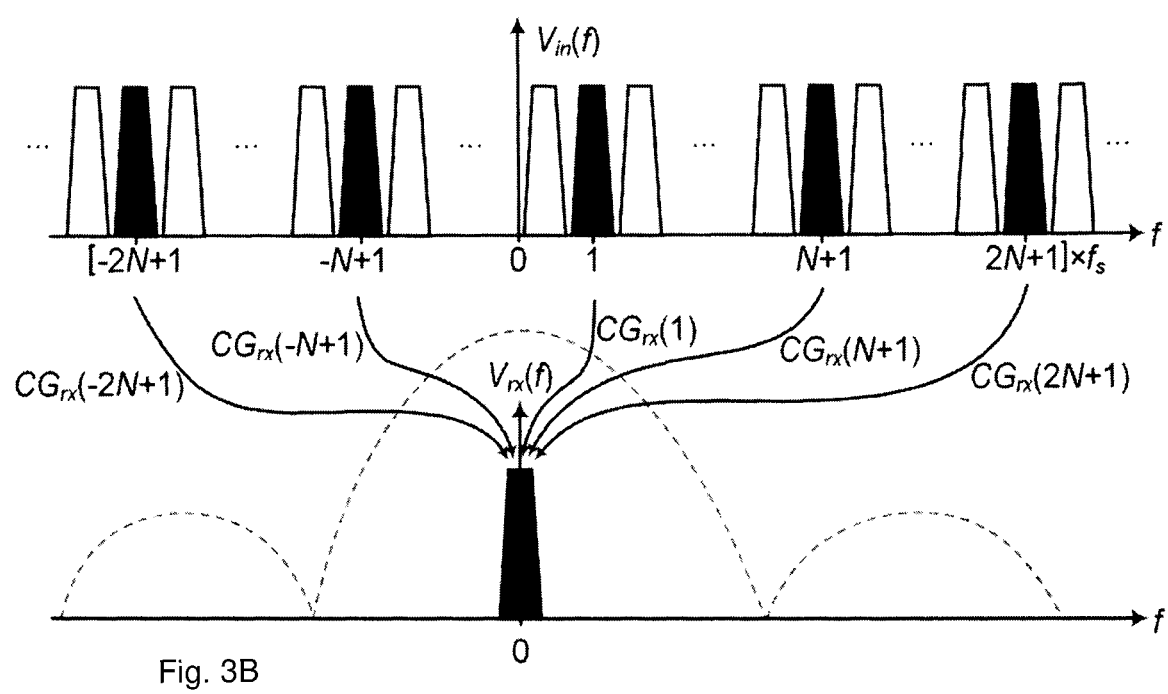
Fig. 3A
Fig. 3B
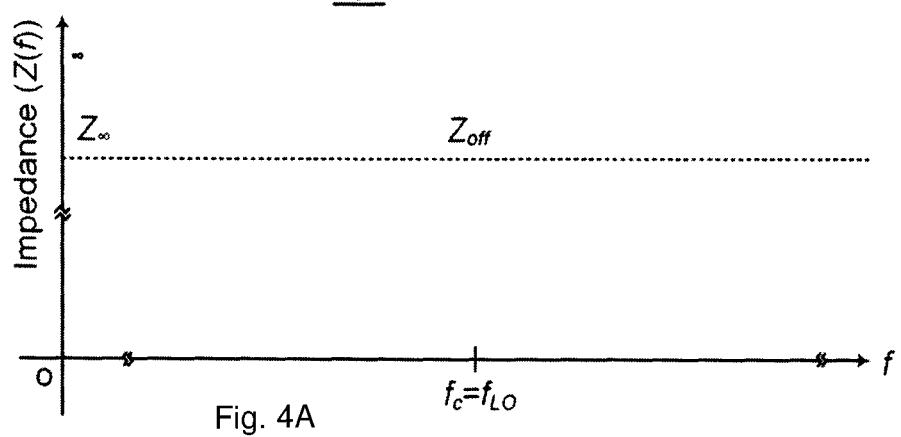
Fig. 4A
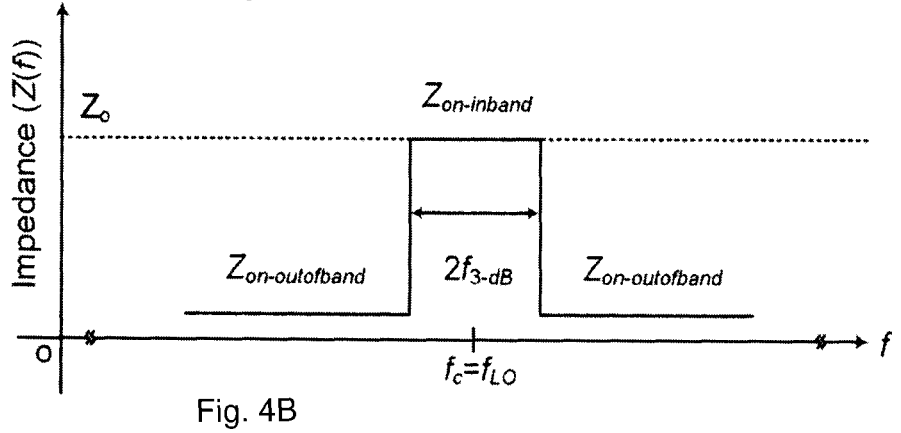
Fig. 4B

An example 4-path RF phase shift network

SYSTEM AND METHOD FOR A FREQUENCY SELECTIVE RECEIVER

FIELD

The present matter is directed to wireless communications and, more particularly to frequency selective wireless receiver architecture operable from tens of kilohertz to terahertz frequencies.

BACKGROUND

A wireless communication device may include a transmitter and a receiver coupled to an antenna to support two-way communications. For data transmission, the transmitter may modulate a radio frequency (RF) carrier signal with data to obtain a modulated signal, amplify the modulated signal to obtain a transmit (TX) signal having the proper signal level, and transmit the TX signal via the antenna to a base station or any other type of wireless receiver device. For data reception, the receiver (Rx) may obtain a receive (RX) signal via the antenna and may condition and process the RX signal to recover data encoded therein. Electronic information radiated from modern wireless transmitters is modeled by Eqn. (a), where 1(t) and Q(t) are the baseband I and Q components, respectively, and $f_{RF}$ is the carrier frequency, of modulated transmitted RF signal r(t).

$$r(t)=Re\{[I(t)+jQ(t)]e^{i2\pi f_{RF}t}\}=I(t)\cos(2\pi f_{RF}t)-Q(t)\sin(2\pi f_{RF}t) \quad (a)$$

A fundamental function of the Rx is to faithfully recover the information contained in the 1(t) and Q(t) signals from the received version of signal r(t) at frequency $f_{RF}$.

Radio receiver Rx circuits are increasingly facing more challenging operating conditions, including for example, improved blocking performance, interference tolerance, selectivity, and tuning capability over a wide frequency range all the while continuing to keep power consumption to a minimum. Performance standards are also becoming more stringent with increasing demand of wireless connectivity, more radios and sensors of various forms being used in close proximity and overcrowding of frequency spectrum with closely spaced signals. Practical implementations of tunable radio receivers would have less than ideal performance in terms of one or more idealized capabilities, including: (a) wideband frequency coverage (b) RF band selectivity, tunability and frequency agility without any attenuation at a given carrier frequency over a wide frequency band, (c) RF bandwidth and filtering order tunability at a given carrier frequency over an entire frequency tuning range of the Rx, (d) complete rejection of in-band and out-of-band blockers and interferers (unwanted signals generated by neighboring transmitters which may cause reduction in the receiver gain, saturation of the receiver, reduction of the receiver sensitivity and degradation of the signal quality preventing proper signal demodulation), without any effect on the Rx gain or other performance metrics, (e) Rx sensitivity close to a thermal noise floor, (f) very high nonlinearity intercept points for the Rx, if any, (g) noise figure of the Rx as close as possible to 0 dB, (h) very high dynamic range, (i) tolerance to circuit and system impairments, and (j) total Rx power consumption as low as possible.

Practical implementations of such a configurable radio receiver would have less than ideal performance in terms of one or more of the qualities enumerated above. There are many different implementations and variations of radio receivers including: conventional quadrature down-conversion receivers such as zero-IF (intermediate frequency), low-IF, or superheterodyne with tunable RF bandpass filters and components; direct sampling receivers; subsampling receivers; multi-port receivers; and passive mixer (P-M) based receivers. Each of these implementations has its own associated advantages and disadvantages. Increased pressure for low power, small form factor, low cost, and reduced bill of materials in wireless applications has resurrected the P-M architectures. Passive mixer reception has several qualities which makes it very suitable for integration as well as multi-band, multi-standard operation. P-M architectures is a zero-IF (or low-IF) architecture that may have the potential of (a) performing concurrent RF filtering and frequency down-conversion, (b) robustness to 1/f noise, and (c) high linearity compared to other mixer-based receiver architectures.

Furthermore, with development of Internet-of-Things (IoT), an ever increasing number of wireless devices, approaching many multi-billions there may be a need energy aware low-power consumption devices or devices with self-charging capability that offer longer operating autonomy without recharging or longer periods between recharging. There is a growing need for more efficient energy usage in the future development of wireless devices and networks. While the proliferation of multiple wireless nodes, radiating interfering RF power may on one hand pose design challenges for receivers, it may on the other hand open a new window of opportunity for energy harvesting or scavenging ambient RF power as a technique, to increase the battery life, or to operate solely from the harvested power.

SUMMARY

In one aspect of the present matter, there is provided a wireless receiver comprising: a signal phase shifting block generating concurrent phase shifted copies of an input signal; an impedance translation block configured to receive one of the respective shifted copies of the input signal and generate a down converted signal.

In accordance with a further aspect the down converted signal is an IF or baseband signal.

In accordance with a further aspect the phases are distributed uniformly over [0 . . . 360 deg].

In accordance with a further aspect there is provided a signal processing block configured to receive down converted signal from the impedance translation block and generate an output baseband signal from the band limited signals.

In accordance with a further aspect there is provided an energy harvesting block coupled to reflection ports of the phase shifting block to receive one or more in-band or out-of-band interferers in said input signal.

In accordance with a further aspect the harvesting block is operable concurrently with receiver decoding of information in an information bearing input signal.

In accordance with a further aspect the energy harvesting block includes an input signal to DC converter.

In another aspect of the present matter there is provided a frequency selective and frequency tunable radio receiver with integrated energy harvesting.

In accordance with a further aspect there is provided an energy harvesting receiver comprising: a signal phase shifting block having one or more input port, two or more phase shifted output ports and one or more reflection output ports and providing reflected signals in-band and/or out-of-band interferers; and an energy harvesting block coupled to said reflection output ports for processing said reflected signals.

In accordance with a further aspect there is provided an energy harvesting receiver that has an enhanced selectivity and sharper out-of-band frequency suppression comprising: two or more signal phase shifting blocks each having one or more input ports, two or more phase shifted output ports and one or more reflection output ports and providing reflected signals in-band and/or out of band interferers; impedance translation function blocks, each configured to receive one signal from said phase shifted output ports and generate in response a band limited baseband or IF signal; and an energy harvesting block; the said phase shifting blocks are connect such that the received signal is coupled to the first phase shifting block, the reflection output ports from one phase shifting block are coupled to the input port(s) of the next phase shifting block and the reflection output ports from the last phase shifting block are coupled to the said energy harvesting block; the said band limited baseband or IF signals are further processed to obtain one or more broader band baseband or IF signals.

In accordance with a further aspect the energy harvesting receiver is configured to receive and decode information in a concurrent multiband signal providing enhanced selectivity and sharper out-of-band frequency suppression.

In accordance with one aspect the input signal is a radio frequency (RF) signal.

BRIEF DESCRIPTION OF THE DRAWINGS

The present matter will become more fully understood from the detailed description and the accompanying drawings, wherein:

FIG. 2A there is shown a simplified block diagram of a generalized N-path receiver according to an embodiment of the present matter;

FIG. 2B shows complimentary clock signals p(t) and $\bar{p}(t)$ of frequency $f_s=1/T_s$ for driving a receiver according to an embodiment of the present matter;

FIG. 2C shows sampling instants for the N paths in a harmonic phase recombination block according to an embodiment of the present matter;

FIG. 3A shows a frequency spectrum of an input RF signal having a desired band limited signal;

FIG. 3B shows frequency down-conversion and harmonic rejection after harmonic recombination at a receiver output according to an embodiment of the present matter;

FIGS. 4A and 4B shows input impedance of an impedance translation circuit at respective on and off periods;

DETAILED DESCRIPTION

Figures 1A, 1B, 1C:
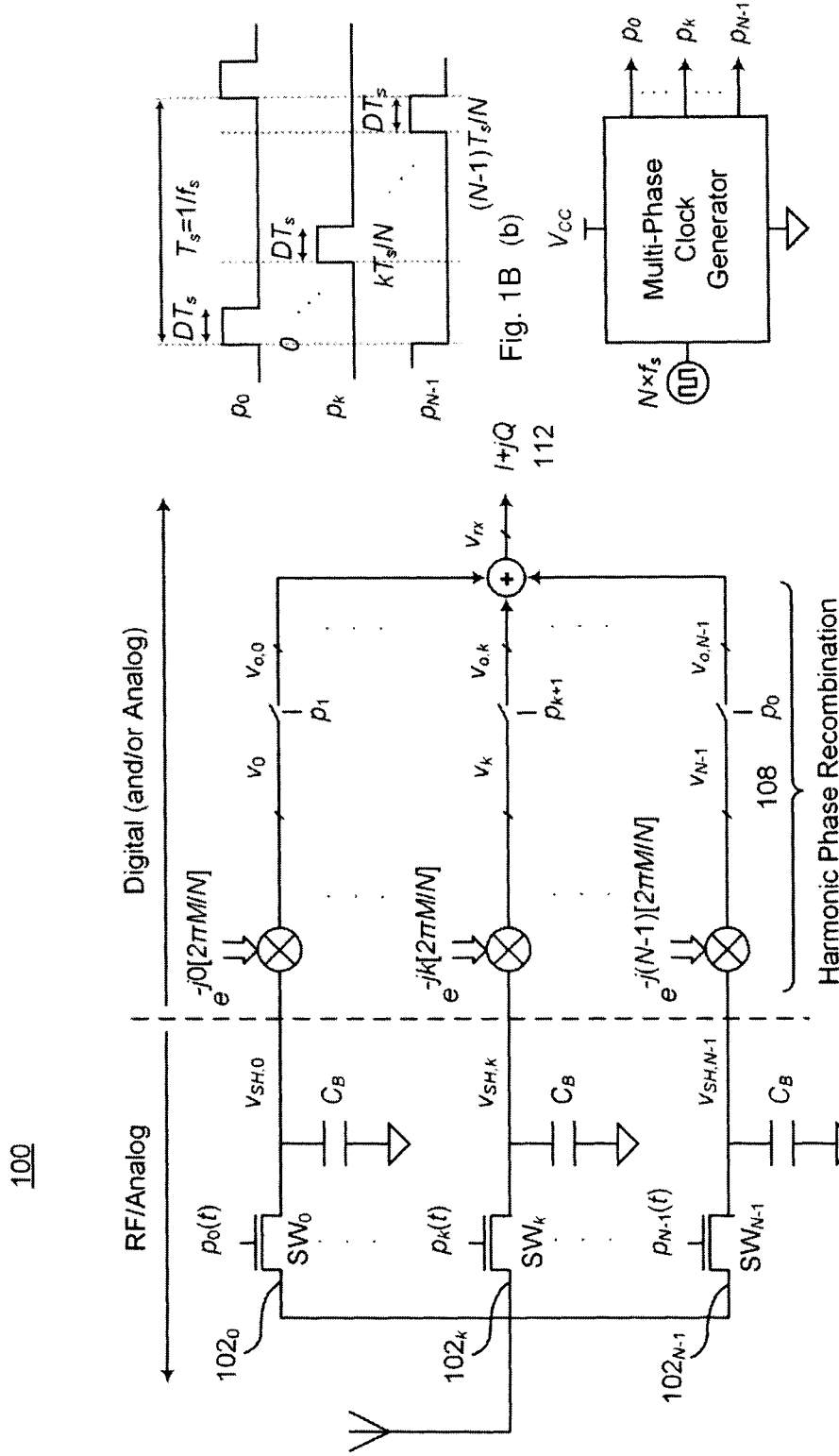
FIG. 1A shows a simplified block diagram of a conventional generalized passive mixer receiver architecture.
FIG. 1B shows non-overlapping pulse waveform signals shifted progressively in time.
FIG. 1C shows a block diagram of multiphase clock generator.

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for purposes of providing a thorough understanding of the exemplary designs of the present disclosure. It will be apparent to those skilled in the art that the exemplary designs described herein may be practiced without these specific details. In some instances, well-known structures and devices are shown in block diagram form to avoid obscuring the novelty of the exemplary designs presented herein. Referring to FIG. 1A there is shown a simplified block diagram of a conventional generalized passive mixer receiver architecture 100. The receiver 100 includes N-paths $102_0 \ldots 102_k \ldots 102_{N-1}$ in parallel each having one of N switches $SW_0$-$SW_{N-1}$ connected to one of N baseband capacitors $C_0$-$C_{N-1}$, each of value CB to form respective switching or commutating nodes for impedance translation. Each switch in the N-paths is coupled to receive an input signal via an antenna as represented by voltage source (not shown)Vin and source resistance Rs. The output voltages of the baseband capacitors are phase-shifted and combined from each of the N paths in the harmonic phase recombination block 108 to allow demodulation of a desired RF band signal and generate the output demodulated I and Q components 112 of the baseband signal. Each of the N switches are controlled sequentially by respective ones of N non-overlapping pulse waveform signals shifted progressively in time by $T_s/N$, as shown in FIG. 1B. These pulse waveform signals are coupled to each of the respective switches from a multiphase clock generator as shown in FIG. 1C. The pulse signals operate the switches $SW_0$-$SW_{N-1}$ "on" and "off" sequentially. The multiphase clock generator shown in FIG. 1C uses a single high speed ($N \times f_s$ or $N/2 \times f_s$) clock source of 50% duty cycle and an active multi-phase clock generator circuit to generate the N non-overlapping clock pulses of reduced speeds ($f_s=1/Ts$) and duty cycles (1/N). In operation N multi-phase clocks drive the N switches to frequency down-convert an I/Q modulated RF signal near/at the carrier frequency of $f_s$ to baseband. A limitation is therefore placed on the maximum RF signal carrier frequency that the receiver 100 can demodulate when the clock source maximum speed equals to N times the RF signal carrier frequency. A further limitation of the receiver 100 is that power consumption is increased due to the high-speed clock switching frequency and the need for the additional active circuit elements to generate multi-phase clock signals from the single high speed clock source. The power consumption increases linearly with the frequency of operation ($f_s$) of the clock and the number of clocks (N) assuming the supply voltage (VCC) and the capacitances of the switching nodes remain identical.

Furthermore, these switching pulse waveforms are also a major contributor of receiver noise due to jitter. Additionally, pulse overlaps due to jitter in the multiple clocks results in signal attenuation, loss and signal-to-noise ratio (SNR) degradation of the output signal. Referring to FIG. 2A there is shown a simplified block diagram of a generalized N-path quadrature phase shift frequency selective (QPS-FS) receiver 200 according to an embodiment of the present matter. The receiver 200 includes an input signal port 201 for inputting an RF signal from an antenna, as represented by voltage source (not shown) Vin and source resistance Rs, and N paths $202_0 \ldots 202_k \ldots 202_{N-1}$ in parallel. Each of the N paths $202_0 \ldots 202_k \ldots 202_{N-1}$ include one of N phase shifters $e^{-jk\alpha_o f}$; k=0,1, . . . , N−1 204 connected between the input port 201 and one of N impedance translation circuits (ITC's) 206 which comprise, in one embodiment, two parallel switches Mp/Mn driven by complimentary (quadrature) clock signals p(t) and $\bar{p}$(t) of switching frequency $f_s$=1/Ts as shown in FIG. 2B. The clock waveforms drive each of the switches concurrently and may be generated from single local oscillator clock generator source where the frequency $f_s$ may be chosen to be at the desired carrier frequency $f_c$ of the input RF signal. The ITC's 206 produce 2N output signals, respectively $v_{SH,k}/\bar{v}_{SH,k}$, k=0,1, . . . , N−1, which are combined, according to sampling instants shown in FIG. 2C, from each of the N paths in a harmonic phase recombination block 208 to allow demodulation of a desired RF band signal and generate demodulated I and Q components 212. These 2N output signals may be low IF or zero-IF signals depending on design parameters chosen. As may be seen, baseband output voltages of the capacitors in the ITCs are captured and processed in digital domain to compensate for any circuit and system impairments. For example for modulated signals based measurements, a first 10% the signal samples may be used as training sequence to calibrate for the impairment parameters.

In operation the received signal r(t) at input port 201 is input to the phase shifters $e^{-jk\alpha_o f}$; k=0,1, . . . , N−1 204 which generates N copies of phase-shifted versions of the received signal r(t) at the carrier frequency $f_{RF}$. Each phase shifter 204 introduces a respective phase change of $e^{-jk\alpha_o f}$; k=0,1, . . . , N−1 in the corresponding RF signal. The ITC's then utilize a single clock pulse waveform of frequency $f_{RF}$ for concurrently sampling all the N phase shifted versions of the RF signal. Impedance translation of the phase changed RF signals are performed when they are passed through the respective ITC's comprised of pairs of complementary driven switches connected to one of 2N baseband capacitors $C_B$. The outputs of the capacitors $v_{SH,k}/\bar{v}_{SH,k}$ may be phase recombined for harmonic rejection and I/Q demodulation as explained below. As described earlier, in general the ITC or translational circuits are periodically driven, time-variant systems and encompass topologies such as "commutated networks" and "N-path filters". These systems cause frequency "translation" (shift) of impedances and transfer functions.

The frequency down-conversion behavior of the QPS-FS receiver is explained as follows. The outputs of the ITCs are represented by their discrete time equivalent samples at the end of the switch on-duration followed by convolution with a rectangular pulse of duration i in time domain. The phase adjusted ITC outputs are represented by their discrete time equivalents after being time multiplexed by the pulse signals $p_k$s during the phase recombination stage. The harmonic phase recombination stages may be implemented in analog or/and digital domain. If the time domain representation is, $$v_{in}(t)=[I_n(t)+jQ_n(t)]e^{j2\pi n f_s t}$$

and the frequency domain representation is, $$V_{in}(f)=I_n(f-nf_s)+jQ_n(f-nf_s)$$

of an actual input RF signal present in a bandwidth BW (2×bandwidth of $I_n$(t) or $Q_n$(t)) and at a carrier frequency (fin=fc=nfs) equal to the nth harmonic of switching clock frequency (fs), then the complementary outputs of the $K^{th}$ path ITC cell are given by Eqn. (1) below, assuming that conditions numbered 1) to 5) below are true. Here In and Qn are the in-phase (I) and quadrature (Q) components, respectively, of an I/Q modulated RF signal present at a carrier frequency fc=nfs.

1) The desired RF signal carrier frequency is $f_c$=$nf_s$.
2) The RF signal at $f_c$=$nf_s$ is a narrowband signal (BW<D/($2\pi(R_s+R_{on})C_B$) where D is the duty cycle of the clock pulse waveform FIG. 2B, $R_{on}$ is the on-resistance of each of the pair of switches Mp/Mn, $R_s$ is the output impedance of the antenna, and $C_B$ is the value of each of the baseband capacitors.
3) Frequency down-converted baseband capacitor voltages ($v_{Kp/n}$) are frequency centered at DC (direct current, i.e. zero frequency) or at IF frequency (intermediary frequency).
4) $DT_s \ll 1/(R_s+R_{on})C_B$ and $f_c \gg 1/(2\pi(R_s+R_{on})C_B)$.
5) The N-path RF phase shift network 204 is also a power dividing passive network so that the output RF voltage at any of its N output ports is $1/\sqrt{N}$ times lower compared to its input voltage values.

$$V_{(K+1)p}(f) = \frac{1}{\sqrt{N}} \frac{\sin(n\pi D)}{n\pi D}[I_n(f) + jQ_n(f)]e^{j\left(n\pi D+K\frac{2\pi n}{N}\right)} \quad (1a)$$

$$V_{(K+1)n}(f) = (-1)^n \frac{1}{\sqrt{N}} \frac{\sin(n\pi D)}{n\pi D}[I_n(f) + jQ_n(f)]e^{j\left(n\pi D+K\frac{2\pi n}{N}\right)} \quad (1b)$$

The (K+1)th path capacitors output voltage signals VKp(f)/VKn(f) are multiplied by a complex constant $e^{-jk[2\pi M/N]}$ to obtain complex baseband signals vmKp/vmKn in the harmonic phase recombination stage 208. These baseband signals are time multiplexed by pulses pk's FIG. 2C to obtain the complementary signals vsKp/vsKn. These time multiplexed output signals are given in Eqn. 2a/2b.

$$V_{sKp}(f) = \sum_{m=-\infty}^{\infty} \left\{ \frac{1/N}{\sqrt{N}} \frac{\sin(n\pi D)}{n\pi D} \frac{\sin(m\pi/N)}{m\pi/N} e^{j\pi\left(nD-\frac{m}{N}+k\frac{2n}{N}-k\frac{2m}{N}-k\frac{2M}{N}\right)} \times [I_n(f-mf_s)+jQ_n(f-mf_s)] \right\} \quad (2a)$$

$$V_{sKn}(f) = \tag{2b}$$

$$\sum_{m=-\infty}^{\infty} \left\{ \frac{(-1)^n/N}{\sqrt{N}} \frac{\sin(n\pi D)}{n\pi D} \frac{\sin(m\pi/N)}{m\pi/N} e^{j\pi\left(nD-\frac{m}{N}+k\frac{2n}{N}-k\frac{2m}{N}-k\frac{2M}{N}\right)} \times \right.$$
$$\left. [I_n(f - mf_s) + jQ_n(f - mf_s)] \right\}$$

Replacing m with −m and summing all $V_{sKp}(f)/V_{sKn}(f)$ for k=0 to N−1 in Eqn. 2, the harmonic phase recombined outputs $v_{op}/v_{on}$ are written as in Eqn. 3.

$$V_{op}(f) = \sum_{k=0}^{N-1} V_{sKp}(f) = \tag{3a}$$

$$\left\{ \sum_{m=-\infty}^{\infty} \left\{ \frac{1}{\sqrt{N}} \frac{\sin(n\pi D)}{n\pi D} \frac{\sin(m\pi/N)}{m\pi/N} e^{j\pi\left(nD+\frac{m}{N}\right)} \times \right. \right.$$
$$\left. [I_n(f - mf_s) + jQ_n(f + mf_s)] \right\}; \begin{array}{c} m+n-M=rN \\ r\in\square \end{array}$$
$$\left. 0, \text{otherwise} \right.$$

$$V_{on}(f) = \sum_{k=0}^{N-1} V_{sKn}(f) = \tag{3b}$$

$$\left\{ \sum_{m=-\infty}^{\infty} \left\{ \frac{(-1)^n}{\sqrt{N}} \frac{\sin(n\pi D)}{n\pi D} \frac{\sin(m\pi/N)}{m\pi/N} e^{j\pi\left(nD+\frac{m}{N}\right)} \times \right. \right.$$
$$\left. [I_n(f - mf_s) + jQ_n(f + mf_s)] \right\}; \begin{array}{c} m+n-M=rN \\ r\in\square \end{array}$$
$$\left. 0, \text{otherwise} \right.$$

We are interested only in the baseband component (m=0) of the signals Vop(f)/Von(f). If even number of paths (N=even) are used in the N-path QPS-FS receiver and M=odd then the resultant frequency down-converted baseband receiver output signal is given by Eqn. 4'.

$$V_{rx}(f) = V_{op}(f) - V_{on}(f) = \tag{4'}$$

$$\left\{ \frac{2}{\sqrt{N}} \frac{\sin(n\pi D)}{n\pi D} e^{jn\pi D} [I_n(f) + jQ_n(f)]; n = M + rN, r \in \square \right.$$
$$\left. 0, \text{otherwise} \right.$$

The receiver output signal Vrx(f) in Eqn. 4 is a frequency down-converted and quadrature (I/Q) demodulated version of the RF signal $v_{in}$ received at a carrier frequency fc=nfs, n∈□. For M=1 in Eqn. 4, the RF signals, FIG. 3A, present at +fs and (1+rN)fs, r∈□ are frequency down-converted to baseband as shown in FIG. 3B while other harmonics in-between are rejected from the output making the contiguous harmonics free tuning range for the N-path QPS-FS receiver from any RF frequency fo to (N−1)fo. The magnitude of the voltage conversion gain for a single branch (CGSE(n)) and the whole receiver (CGrx(n)) for a complex signal present at nth harmonic of fs (fin=nfs) are given by Eqn. 4 and Eqn. 5, respectively.

$$CG_{SE}(n) = \frac{1}{\sqrt{N}} \frac{\sin(n\pi D)}{n\pi D} \tag{4}$$

$$CG_{rx}(n) = \frac{2}{\sqrt{N}} \frac{\sin(n\pi D)}{n\pi D} \tag{5}$$

The baseband 3-dB low-pass cutoff frequency (f3-dB), and hence the RF half-bandwidth of this frequency conversion, is estimated by Eqn. 6.

$$f_{3dB} = \frac{D}{2\pi(R_s + R_{on})C_B} \tag{6}$$

During on state of the receiver, because of transparent nature and the reciprocity property of the ITCs to the RF and the baseband signals, the frequency down-converted baseband voltage signals of the capacitors are frequency up-converted and appear as RF signals at the input of the ITC cell for the input RF signals present at harmonics of the switching frequency ($f_{in}$=nf$_s$, n∈□) as the RF signals at the inputs of the ITCs appear as baseband signals across the capacitors. For far away non-harmonic input RF signals present in frequency band outside the bandwidth 2'$f_{3dB}$ in Eqn. 6, the output baseband voltages are zero and in these cases there are no frequency up-converted RF versions of the baseband voltages in ideal condition. In an idealized situation, this transparency property of the switching network results in two different input impedances for the ITC cells at their inputs. The ITC cells of the receiver display two different impedances at their inputs in frequency domain when the local oscillator (LO) clock signal is on and the switches are operating on and off sequentially. An idealized approximate impedance of $Z_{on\text{-}inband}$ is displayed in a bandwidth 2×$f_{3\text{-}dB}$ at/around the input RF signal carrier frequency equal to the LO clock frequency and another impedance of $Z_{on\text{-}outofband}$ is displayed outside the said frequency band. The impedances $Z_{on\text{-}inband}/Z_{on\text{-}outofband}$ in different frequency bands are presented by the ITC cells to the RF phase shift network only during on state of the receiver. During off state of the receiver, the switches in the ITC cells are not operating and in this state the ITCs will display high impedance ($Z_{off}$) for the signals in all frequency bands of the receiver. Usually $Z_{on\text{-}outofband}$ and $Z_{off}$ are very low and very high, respectively, compared to $Z_{on\text{-}inband}$ for the receiver where $Z_{on\text{-}inband}$ is targeted to be impedance matched to RF phase shift network in the RF path of the receiver system. The notion of different impedances during on and off state of the receiver are shown in FIGS. 4A and 4B. The values of $Z_{on\text{-}inband}$, $Z_{on\text{-}outofband}$, and $Z_{off}$ are estimated using Eqn. 7.

$$Z_{on-inband} \approx R_{on} + \left((R_{on} + R_s)\frac{\text{sinc}^2(D)}{1 - \text{sinc}^2(D)}\right) \tag{7a}$$

$$Z_{on-outofband} \approx R_{on} \tag{7b}$$

$$Z_{off} \approx \infty \tag{7c}$$

Due to switching of the transistors in the ITCs the noise at the capacitor output voltages are the aliased/folded noise due to $R_s$ and $R_{on}$. The noise power spectral density for a resistor R is assumed to be 2kTBR for both positive and negative frequencies for single side band (SSB) noise figure calculation of the N-path QPS-FS receiver where k is Boltzmann's constant, T is absolute temperature, and B is the noise bandwidth. Worst case single-sideband noise factor for a single branch ($F_{SE}$) of the N-path QPS-FS receiver is given by Eqn. 8 while that for the whole receiver ($F_{rx}$) is estimated by Eqn. 9 assuming the RF phase shift network is also a signal power dividing network but noise power at its input and output ports remains the same for worst noise analysis.

$$F_{SE} \le \frac{N}{D} \frac{1}{\text{sinc}^2(D)} \left(1 + \frac{R_{on}}{R_s}\right) \quad (8)$$

$$F_{rx} \le \frac{1}{2D} \frac{1}{\text{sinc}^2(D)} \left(1 + \frac{R_{on}}{R_s}\right) \quad (9)$$

The sinc(·) function is defined as $\text{sinc}(x)=\sin(\pi x)/\pi x$ and noise figure (NT) is obtained from the noise factor (F) using the relation $NF=10 \log_{10}(F)$.

The QPS-FS receiver operates on a single pair of complimentary clocks having 50% duty cycle at a speed of $f_s$, if the desired RF signal for frequency direct down-conversion is present at $f_c=f_s$. For low IF down conversion at $f_{IF}$, fc is slightly different from the fs ($f_{IF}=f_c-f_{RF}$ or $f_{IF}=f_{RF}-f_c$).

Lower source clock frequency operation and removal of active multi-phase clocks generation circuit from the present embodiment reduces the total power consumption of the receiver system.

The RF signal at the antenna input of the QPS-FS receiver in a normal communication environment consists of blockers and interferers in addition to the desired RF signal at a carrier frequency of $f_c=f_s$. The blockers and the interferers undergo the same phase shifts in the RF phase shifts network as intended for the desired RF signal. When this combination of RF and blockers/interferers signals reach the input of an ITC cell, the RF signal present in a bandwidth $2 \times f_{3dB}$ at frequency $f_c=f_s$ sees an impedance match for the signal while all other RF signals see an impedance mismatch. The desired RF band signal is frequency down-converted into the baseband capacitors voltages in the information decoder while all the other RF signals are reflected from the inputs of the ITC cells making the present embodiment tolerant to blocker and interferer signals.

The quadrature phase shift frequency selective (QPS-FS) receiver architecture according to embodiments of the present matter may reduce or eliminate the high-speed clock source and an active multi-phase clocks generation circuit necessary in the conventional receivers. This contributes to lower power consumption. Furthermore, embodiments of the present matter may provide for decoupling from a dependence on the high-speed clock thereby allowing for higher RF signal carrier frequency operation for the receiver and provide for robustness against clock jitter by use of the single common clock of speed $f_s$ to drive all the switches. Still further, embodiments of the present matter provide for enhanced frequency bandwidth of the receiver resulting from the lower speed clock source and elimination of the active multi-phase clocks generation circuit.

The receiver components in the QPS-FS receiver thus may include an antenna having one or multiple radiating elements, the phase shift network followed by the impedance translation circuits, the outputs of which are processed further by the harmonic phase recombination portion of the receiver which could be implemented using analog or/and digital techniques. Signals travelling from the antenna to the baseband capacitors are the RF signals while the capacitors hold only the frequency down-converted baseband signals suppressing any RF signals or their harmonics from the outputs. The chain after the capacitors outputs consists of baseband blocks with high input impedance and low noise figure. We define frequency coverage as the minimum of the maximum frequency bands for which the antenna, the phase shift network and the impedance translation circuits provide acceptable performance in terms of S-parameters, conversion gain, noise figure, low power consumption and other performance metrics. For a given clock signal source of maximum speed, the QPS-FS receiver covers N times wider frequency bands in comparison to the conventional P-M receiver utilizing the same clock signal source. Furthermore, the receiver according to the present matter may operate from tens of megahertz to many GHz more than 10 GHz—possibly to millimeter-wave frequencies. Additionally, the receiver may provide concurrent reception of multiple channels (carrier aggregation) for higher data rates. Furthermore, as may be seen, frequency conversion and selectivity behavior of the receiver may be effected by switching signal (local oscillator LO) amplitude and bias levels which may be adjusted so that the effective clock duty cycle and input impedance of the ITC cells adjust themselves to provide maximum conversion gain and optimal bandwidth for conversion of RF voltages to baseband voltages. For example, with the RF signal level at the antenna input port of the receiver set at a predetermined value, the down-converted intermediate frequency (IF) was fixed at for example $f_{IF}=0.1$ MHz, the CW RF signal was sent at a frequency $f_{RF}=f_{LO}+f_{IF}$ for different frequency bands of operation ($f_{LO}$). The frequency band of operation may be changed by changing the CW LO signal frequency ($f_{LO}$) and the corresponding RF signal frequency ($f_{RF}=f_{LO}+f_{IF}$). The frequency selectivity behavior of the QPS-FS receiver was verified for different RF bands (decided by $f_{LO}$ and the corresponding $f_{RF}$) using CW RF signals sent at frequencies $f_{RF}=f_{LO}+f_{IF}$ where $f_{LO}$ is fixed for the band of interest and the intermediate frequency ($f_{IF}$) is swept so that the frequency down-converted IF signal falls at a frequency$_{IF}$. The amplitude levels of the IF signal recorded and plotted against the $f_{IF}$ values, provided that the measured output frequency down-conversion behavior from RF to IF shows a bandpass filter response in the RF band of the receiver and as a low-pass filter response in the baseband. In general, the bandwidth of the frequency down-conversion from RF to baseband process is independent of the RF signal carrier frequency and depends only on the source impedance, the switch on-resistance value, baseband output capacitor value and the duty cycle of the clock pulse waveforms driving the switches.

Figure 5:
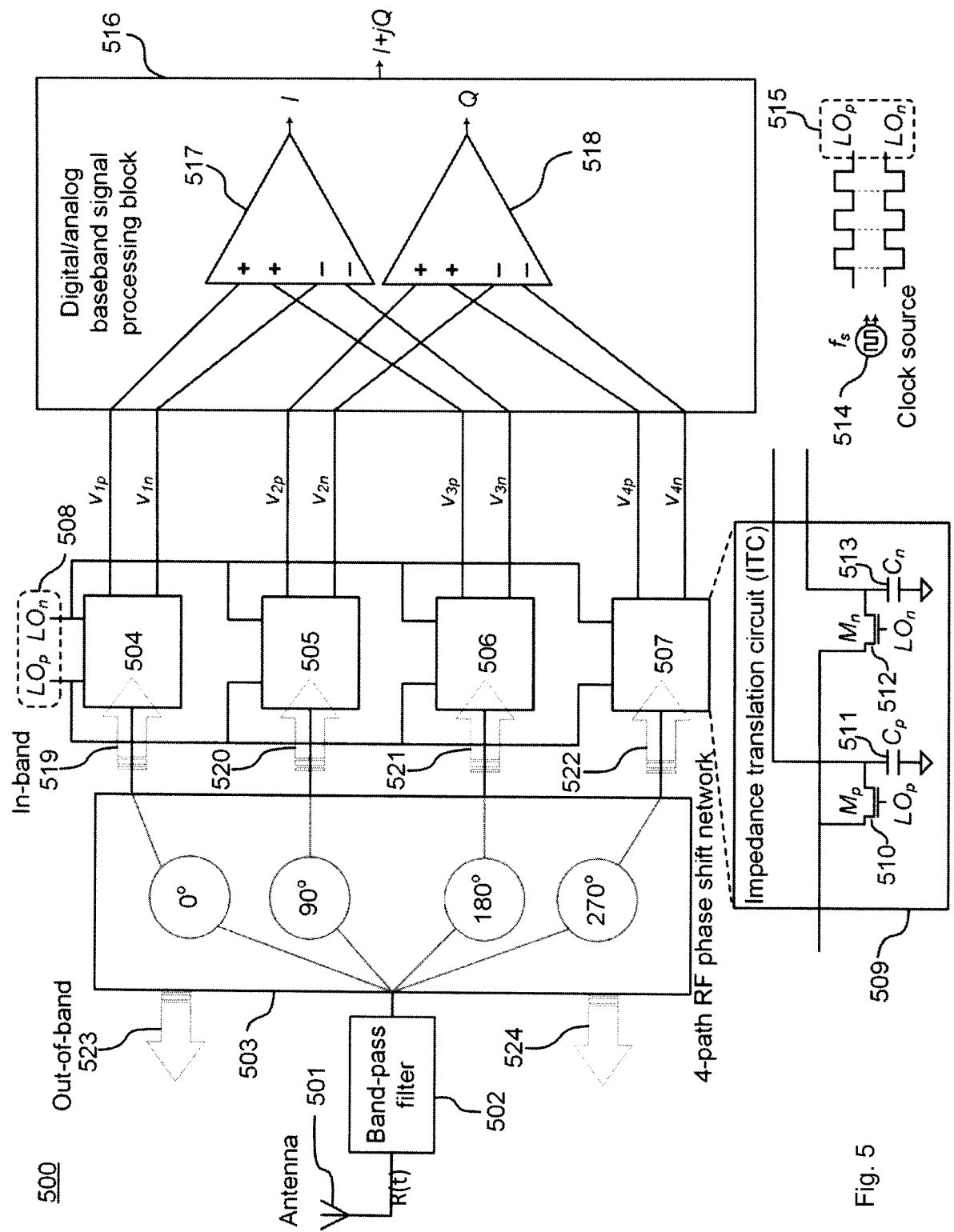
FIG. 5, shows a block diagram of a 4-path receiver according to another embodiment of the present matter.

Referring to FIG. 5, there is shown a block diagram of a 4-path receiver 500 according to another embodiment of the present matter. The 4-path receiver 500 is another embodiment of the generalized N-path architecture where N=4. As previously described an input RF signal 501 may be applied to the receiver input port. The input RF signal is passed to four parallel phase shifts 503, respectively, which generates four copies of phase-shifted versions of the received signal r(t) at carrier frequency $f_{RF}$ and utilizes a single clock pulse waveform or local oscillator signals $LO_p/LO_n$ of frequency $f_s=f_{RF}$ from the clock source, for sampling all the four versions of the RF signal in the impedance translation circuits 504-507. As previously described the ITC's may be two parallel connected switches with one common input RF terminal and other two terminals terminated with baseband capacitors, as shown in the exploded block 509. The switches are operated on and off sequentially by the pair of complementary clock signals $LO_p/LO_n$ having 50% duty cycle and a frequency equal to the carrier frequency of the desired in-band RF signal. The output signals ($v_{Xp/n}$) obtained across the baseband capacitors may be processed further using analog and/or digital techniques. The baseband signal processing can be targeted towards harmonic phase-recombination to cancel baseband outputs from the harmonic carrier frequencies RF signals or to compensate for any signal and system impairments. The receiver 500 may include a bandpass filter 502 at the RF input so that all other unwanted harmonic RF signals are rejected outside the frequency tuning range of the receiver ($f_{min}$ to $f_{max} < 3f_{min}$, if $f_{min}$ is the smallest frequency coverage requirement of the receiver). In contrast for the N-path QPS-FS receiver embodiment in FIG. 2, higher order harmonics can be cancelled using harmonic phase recombination shown and the receiver can be made harmonics free tunable over a much wider frequency coverage range. The eight output signals from the ITCs are further filtered and processed in the analog domain (differential amplifiers) or digitally (high impedance analog-to-digital-converter (ADC) followed by a digital-signal-processor (DSP)), and the frequency down-converted and demodulated baseband signals I(t) (or I[n]) and Q(t) (or Q[n]) are obtained. In other words, the receiver may perform concurrent impedance translation from baseband to RF frequency ($f_{RF} = f_{LO}$) and I/Q demodulation of a bandlimited RF signal present at $f_{RF} = f_{LO}$ to baseband.

Figure 6:
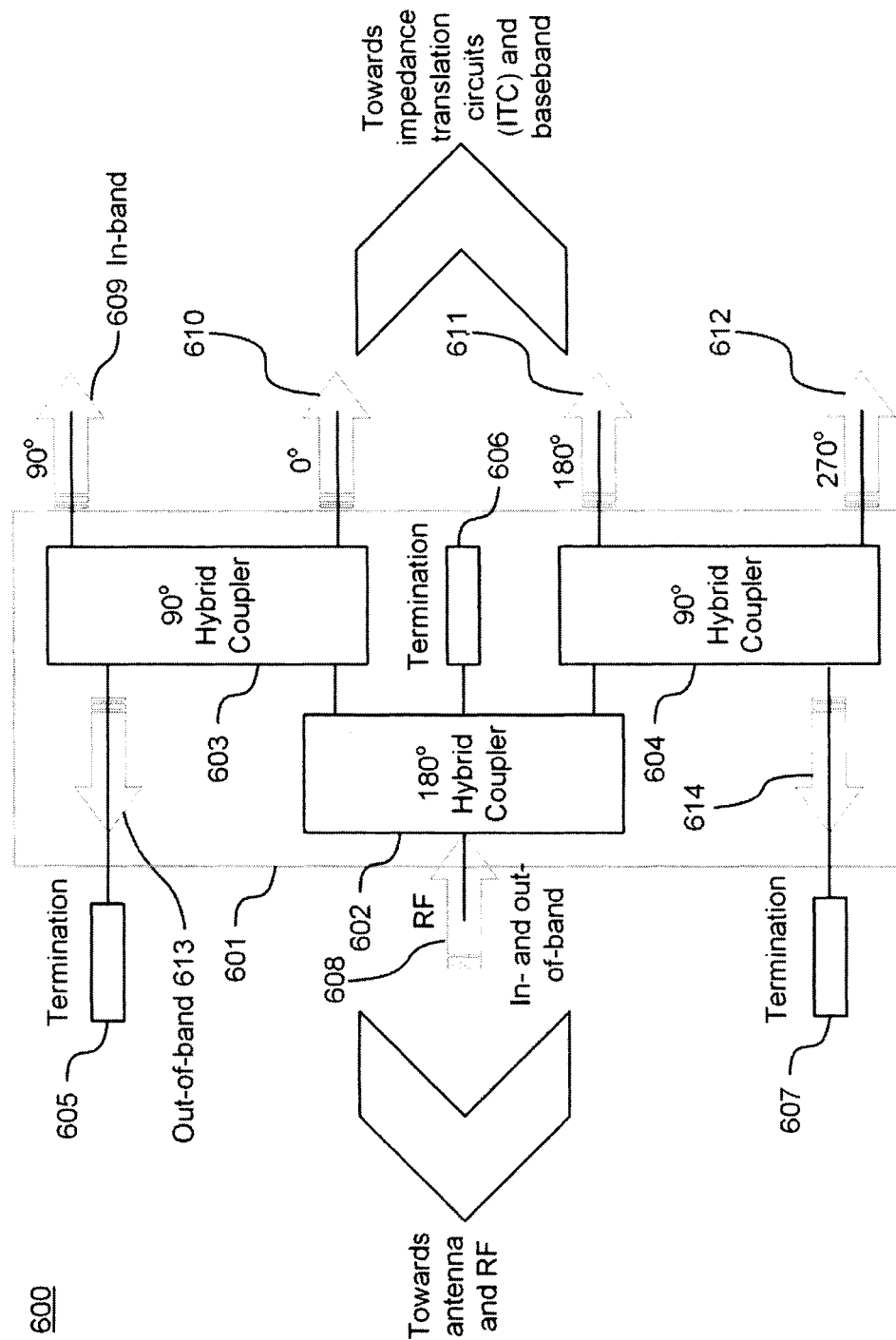
FIG. 6 shows an example implementation of a RF phase shift network for the 4-path receiver, according to an embodiment of the present matter.

Referring to FIG. 6 there is shown an example implementation of a RF phase shift network 601 for the 4-path receiver, according to an embodiment of the present matter. The phase shift network 601 includes one 180° hybrid coupler 602 and two 90° 603/604 quadrature hybrid couplers. The four output ports of this phase shift network are terminated with the impedance translation circuits. The interferer and blocker signals are reflected by the ITCs and absorbed in the terminations 605, 606 and 607. In this 4-path RF phase shift network half of the blockers power is reflected back to the 180° hybrid while the other half is absorbed in the matched terminations at the isolation ports shown in FIG. 6.

Figure 7:
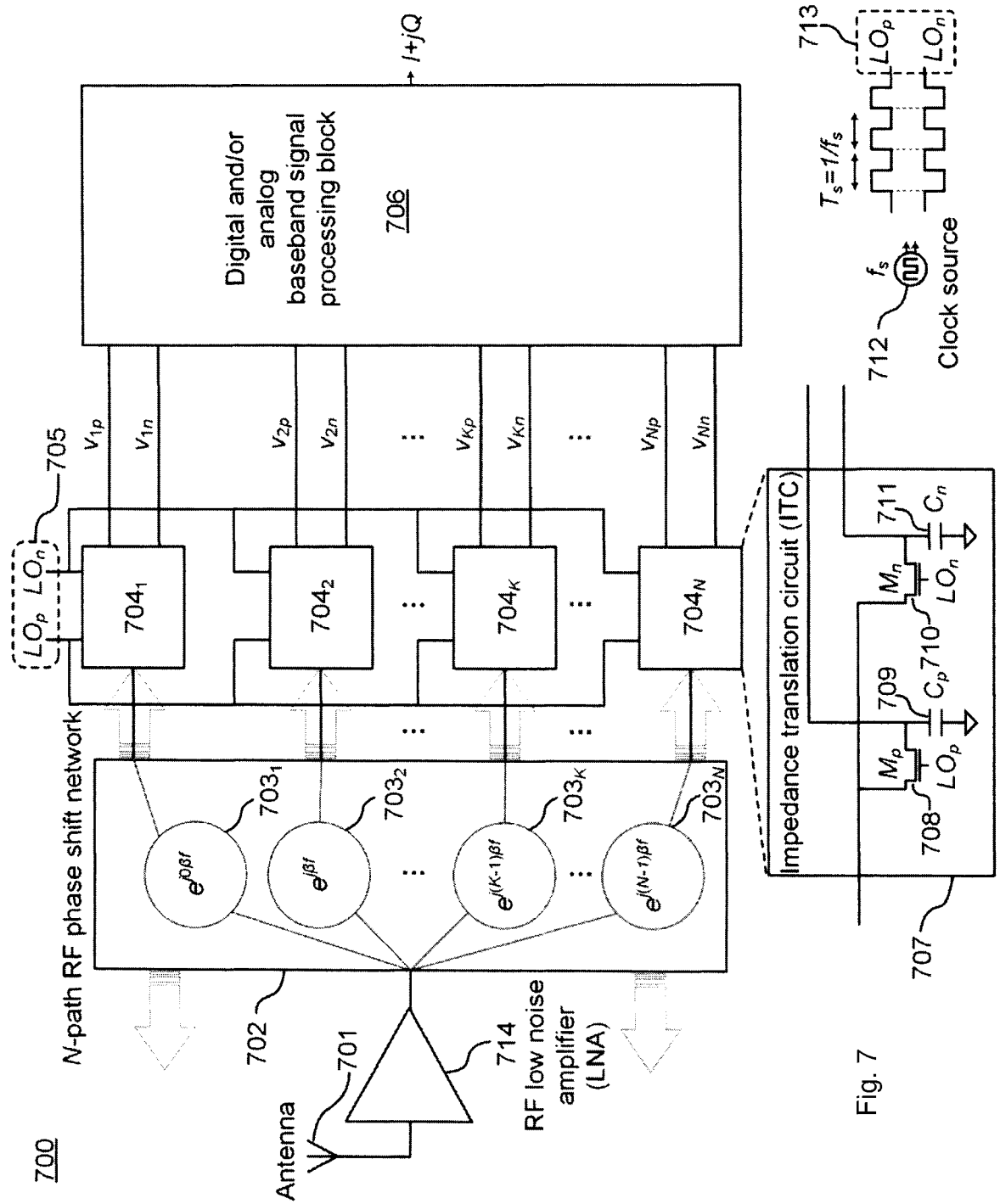
FIG. 7 shows a further receiver configuration according to an embodiment of the present matter.

Referring to FIG. 7, there is shown a further receiver configuration 700 according to an embodiment of the present matter. The receiver 700 is similar in configuration to the generalized N path receiver 200, however the receiver 700 includes a low noise amplifier 714 in the input RF path.

Figure 8:
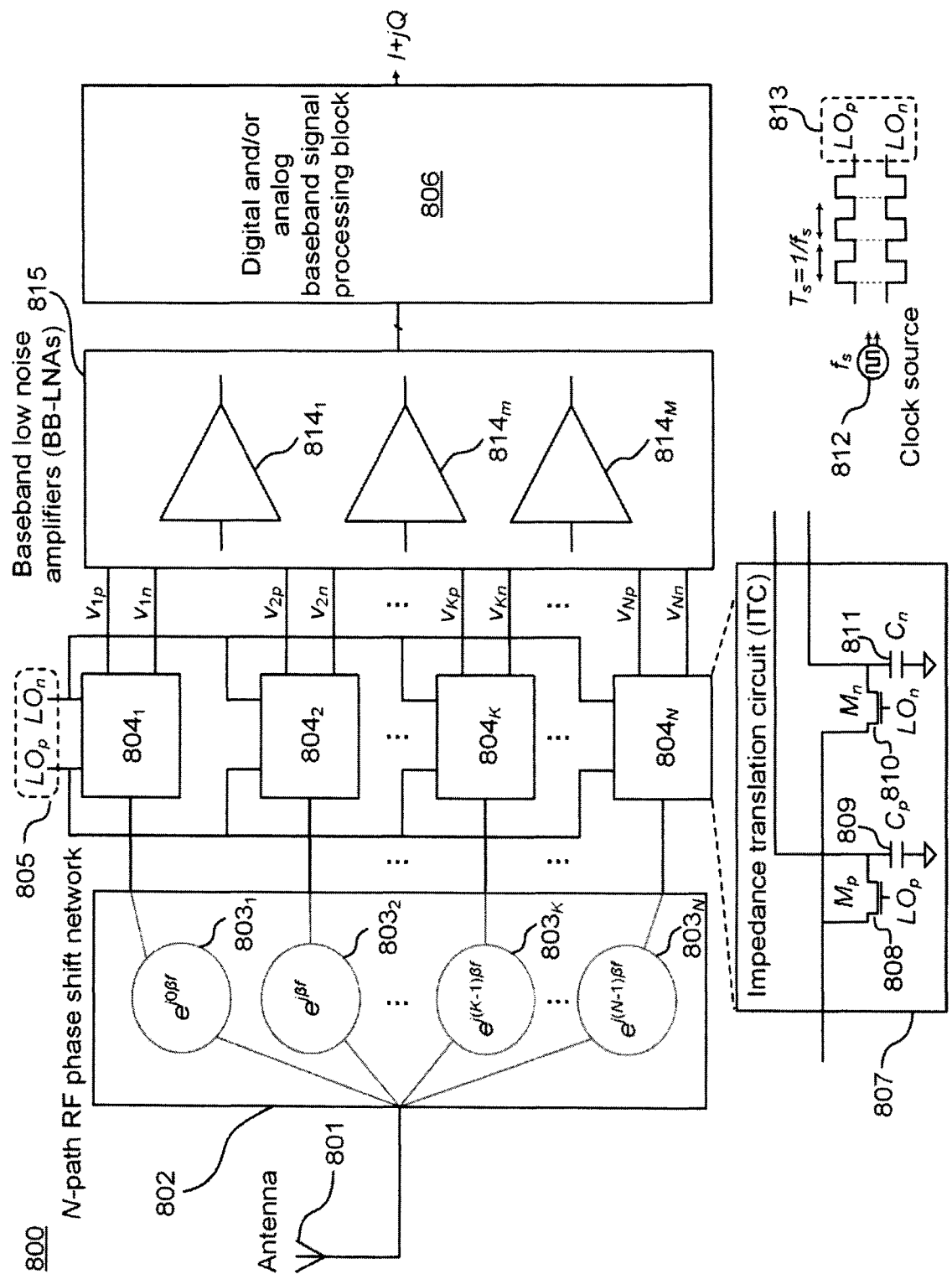
FIG. 8 shows a still further receiver configuration according to an embodiment of the present matter.

Referring to FIG. 8, there is shown a still further receiver configuration 800 of the receiver according to an embodiment the present matter. The receiver 800 is similar in configuration to the generalized N path receiver 200, however the receiver 800 includes a baseband low noise amplifier 815 in the baseband path for amplification and signal conditioning.

Figure 9:
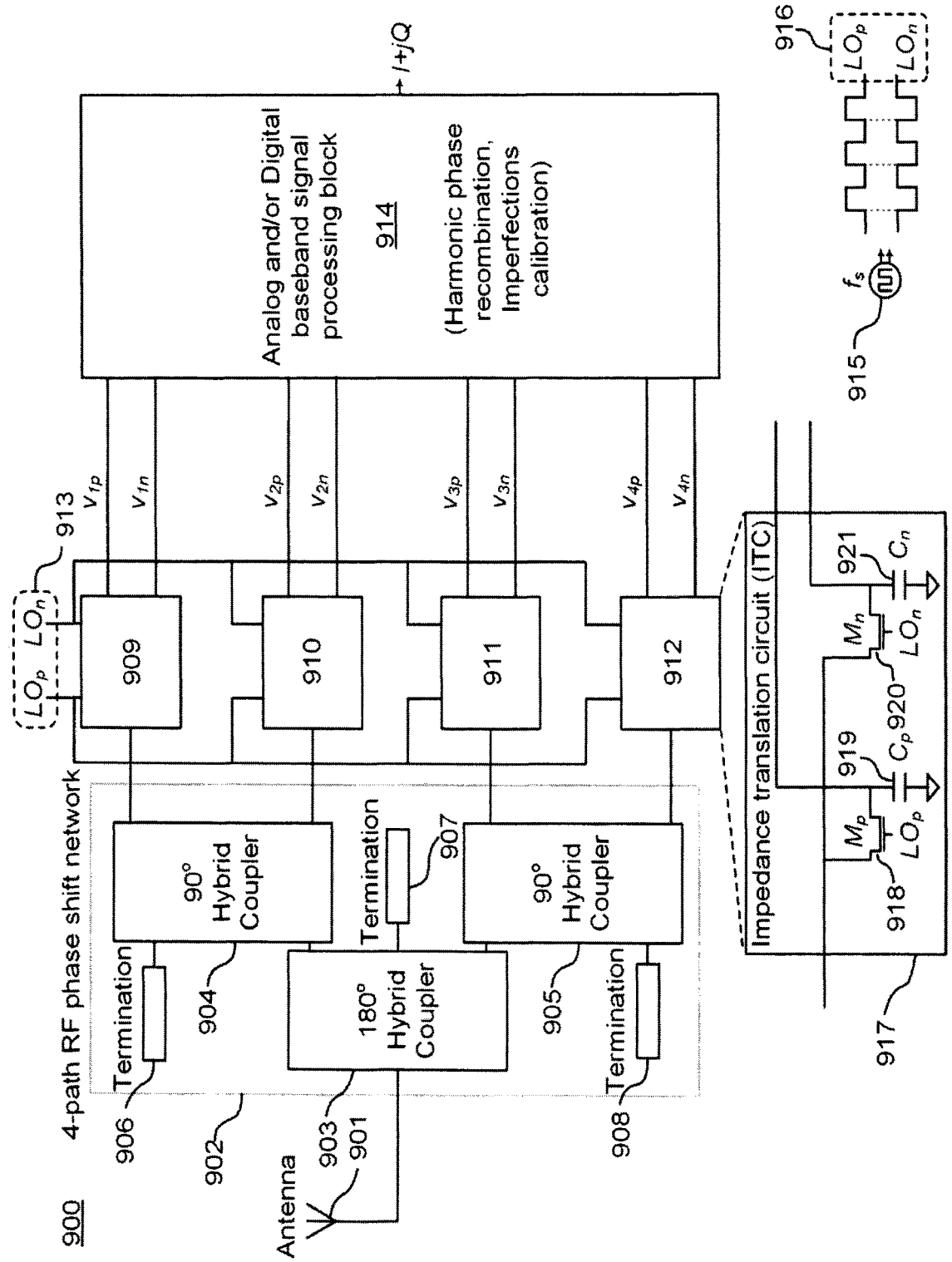
FIG. 9 shows a 4-path receiver configured with the phase shift network according to an embodiment of the present matter.

Referring to FIG. 9, there is shown a 4-path receiver 900 configured with the phase shift network 600 of FIG. 6. As previously mentioned with respect to the phase shift network 600, reflected energy is terminated by suitable terminations at the reflection ports of the network and in the receiver configuration 900 these terminations are indicated by 906, 909 and 907. However, these reflected blockers and interferer signals may be collected and energy recycled using an RF energy harvesting (EH) block (as explained below). As illustrated, the antenna is connected directly to the phase shift network, which allows for any interferers or blockers falling within the intended frequency band of coverage of the receiver to undergo similar amplitude and phase shifts by the phase shift network as originally planned for the desired RF band signal. When this phase-shifted combination of the desired RF signal and the undesired interferes reach the junction of the phase shift network output and the ITC input, the desired RF band signal is frequency down-converted into the output capacitor voltages as baseband signals, while the interferers are reflected back and absorbed into terminations 906, 909 and 907. The interferer signals reaching terminations 906, 909 and 907 may be energy recycled by combining all the interferers and blockers and suppling them to a wideband energy harvesting system for DC power generation and storage. In this manner, the same information bearing RF signal may be used by the energy harvesting receiver according to embodiments of the present matter for concurrent information decoding and energy harvesting.

Figure 10A:
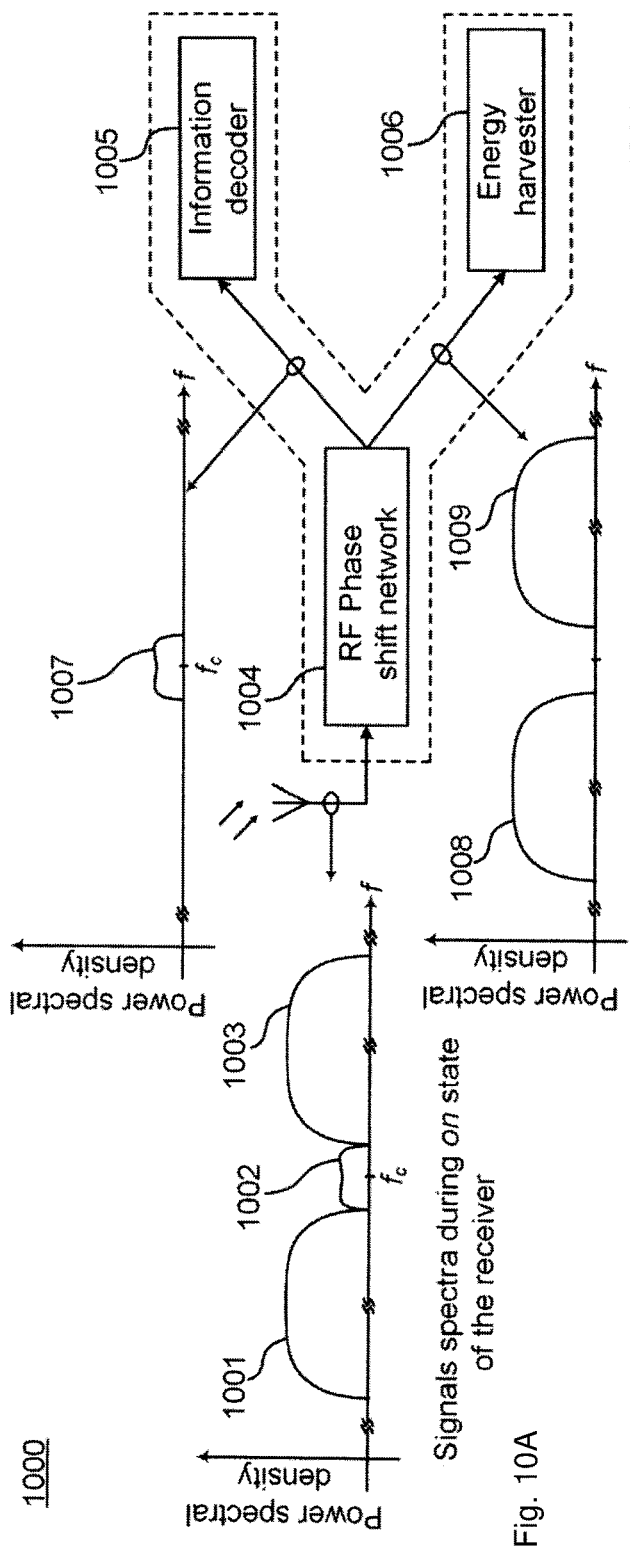
FIGS. 10A and 10B show graphically conditions of on-state and off-state energy harvesting in an N path receiver according to an embodiment of the present matter.
Figure 10B:
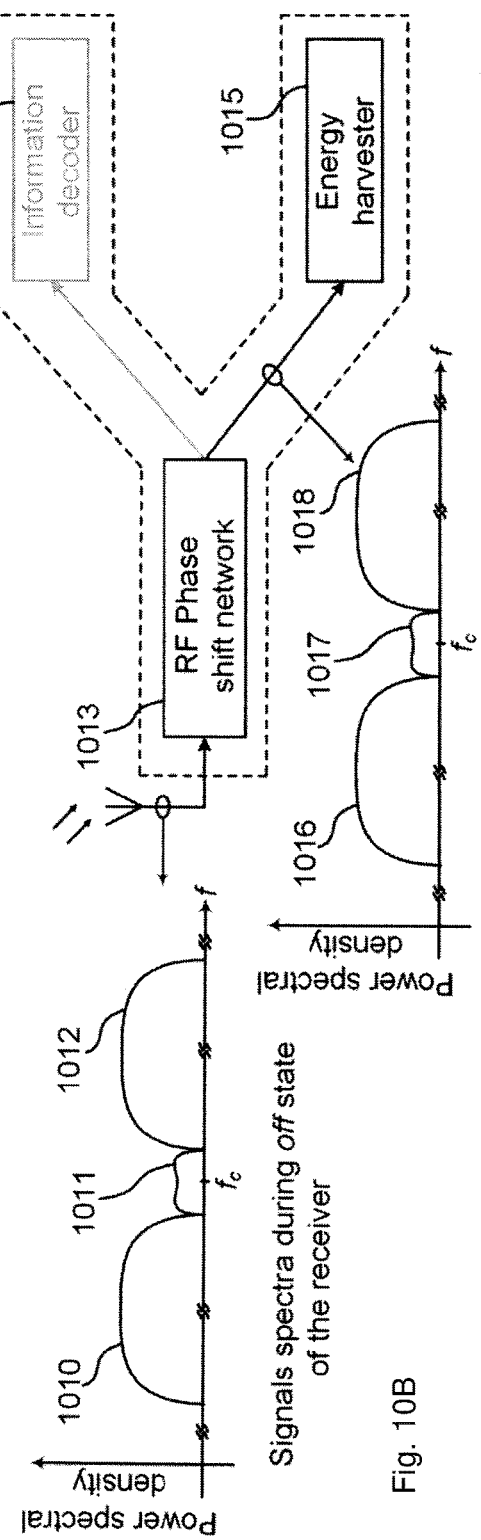

Referring to FIGS. 10A and 10B there is shown graphically conditions of on-state and off-state energy harvesting in an N path receiver according to an embodiment of the present matter. Specifically, referring to FIG. 10A there is shown graphically 1000 interferes and blockers RF power energy harvesting during an on state of the receiver when in-band RF signal is frequency down-converted to baseband for information transfer, and there is shown in FIG. 10B both in-band RF signal and interferes and blockers RF power energy harvesting during off state of the receiver when frequency down-conversion section of the receiver is turned off.

Figure 11A:
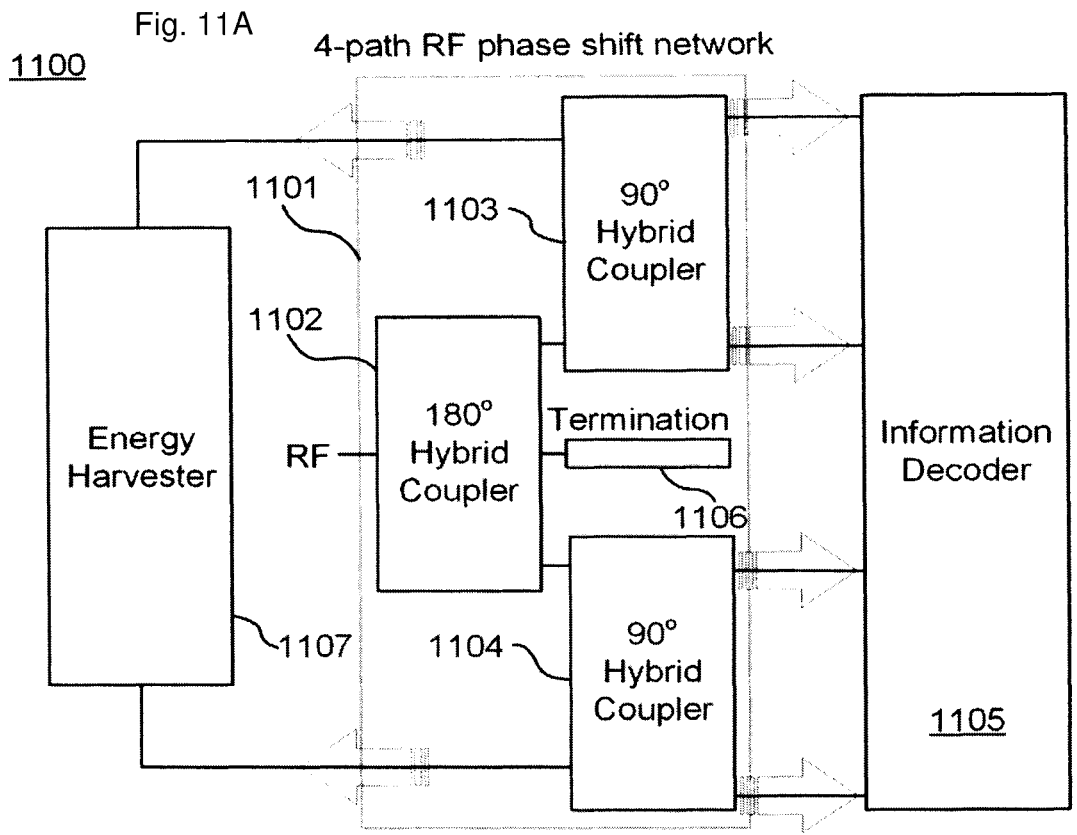
FIGS. 11A and 11B show configurations of energy harvesting receivers according to embodiments of the present matter.
Figure 11B:
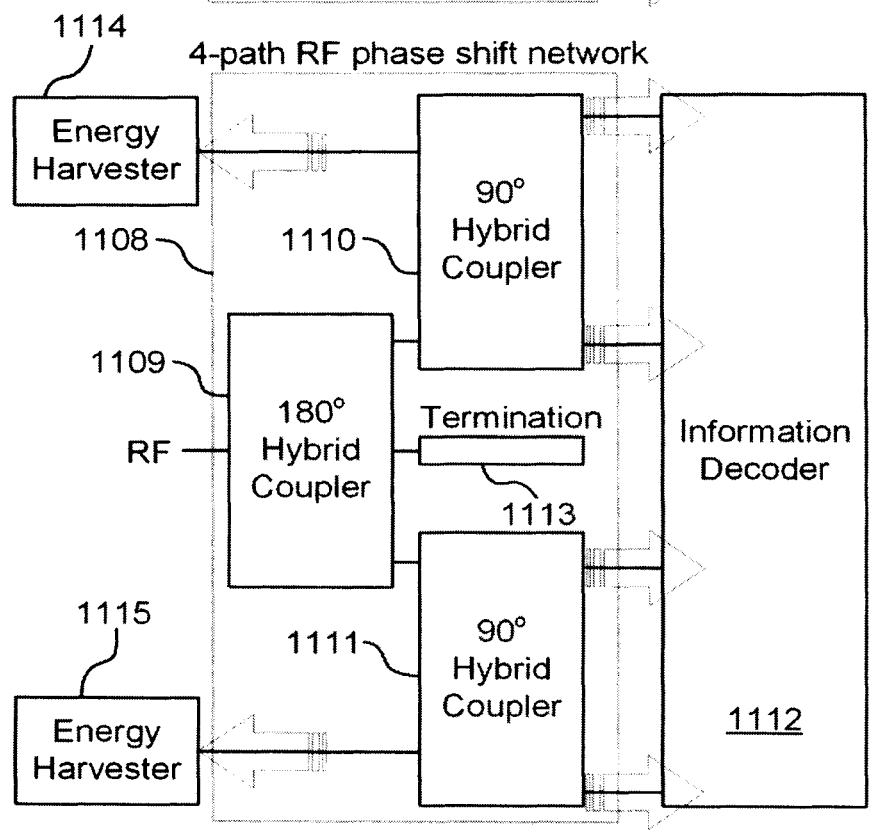

Referring to FIG. 11A there is shown a further configuration of an energy harvesting receiver 1100 according to an embodiment of the present matter. In this configuration 1100 two of the reflected interferer/blocker signals could be combined and energy harvested using a single energy harvester 1107. In contrast separate energy harvesters 1114 and 1115 at each of the ports of reflected interferer/blocker signals could be used as shown in FIG. 11B.

Figure 12:
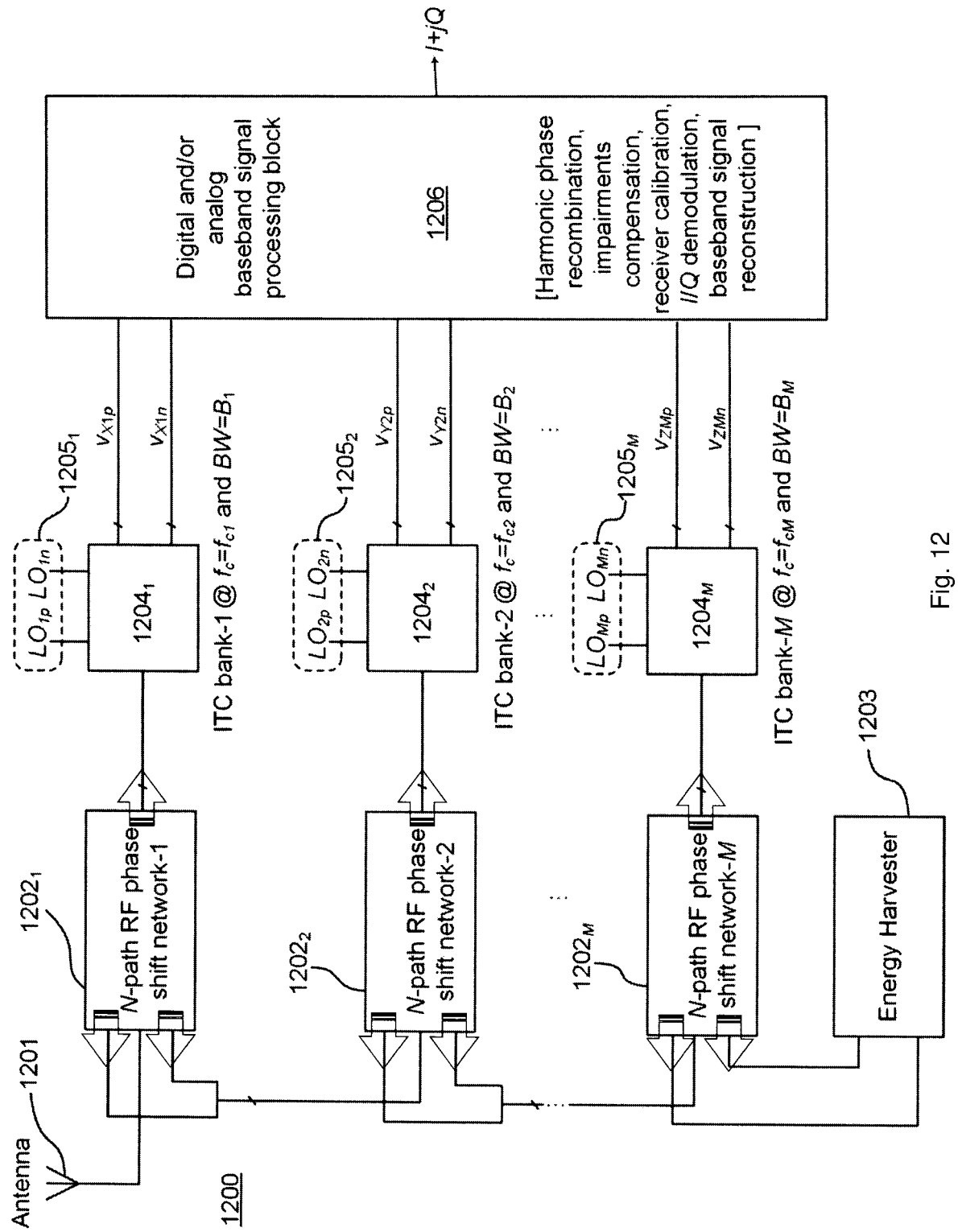
FIG. 12 shows a configuration of a cascaded energy harvesting receiver according to an embodiment of the present matter.

Referring to FIG. 12 there is shown a configuration of a cascaded receiver 1200 according to an embodiment of the present matter. The receiver 1200 includes a plurality of cascaded N path phase shifters $1202_1$ to $1202_M$. Each of the N path phase shifters is coupled to output in-band signals to corresponding ones of a plurality of N path ITC's $1204_k$. The outputs of the ITC's are fed to a digital or analog baseband signal processing block as previously described herein. The RF input port of the first phase shifter $1202_1$ in the cascaded chain of phase shifters is coupled to receive an RF signal from the antenna. However, one or more of the reflection ports of the first phase shifter $1202_1$ are coupled to the RF input port of a subsequent phase shifter $1202_2$ and the reflection port of this phase shifter $1202_2$ is in turn connected to the RF input of the subsequent phase shifter in the cascade and so on until the last phase shifter $1202_M$. The last phase shifter $1202_M$ may have its reflection port terminated in an energy harvester block for an energy harvesting receiver or may be, simply just, terminated. Each of the phase shifters $1202_k$ coupled to its own ITC $1204_k$ and may be driven at a switching frequency responsive to a particular bandwidth, and carrier frequency in the input RF signal.

Figure 13A:
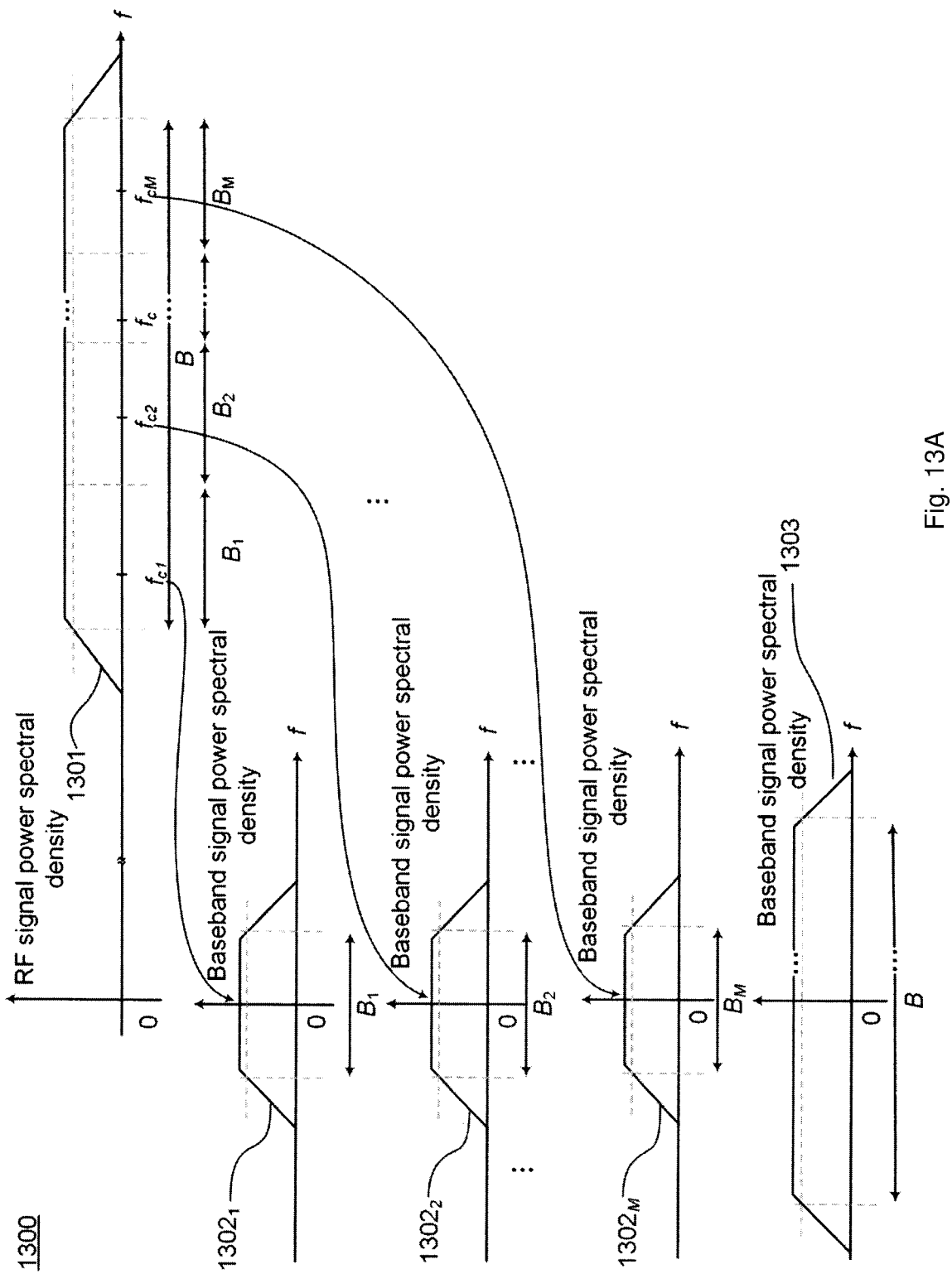
FIG. 13A shows graphically a frequency spectrum processed by a receiver according to an embodiment of the present matter.
Figure 13B:
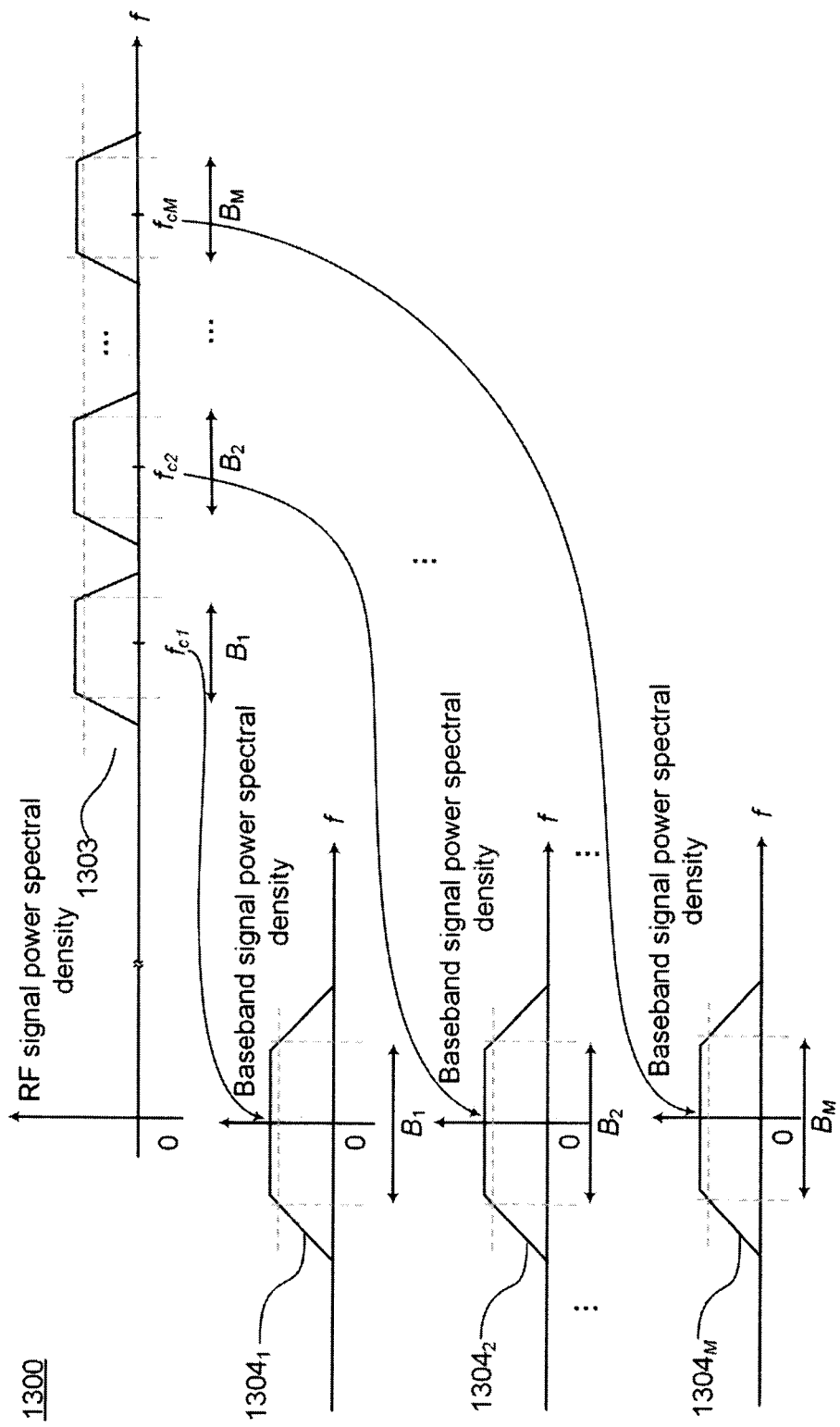
FIG. 13B shows graphically a multi-band frequency spectrum processed by a receiver according to an embodiment of the present matter.

Referring now to FIG. 13A, there is shown graphically 1300 a frequency spectrum of a received RF signal 1301 that may be processed by the cascaded receiver configuration 1200 to generate a wideband baseband 1303 or IF signals $1302_k$. k=1 to M. This configuration 1200 may provide a receiver with better selectivity (better interferers and blockers rejections) than a configuration with only one receiver with one N path phase shifter. Referring to FIG. 13B, there is shown, similar to FIG. 13A, graphically a frequency spectrum 1303 of a received RF signal that may be processed by the cascaded receiver configuration 1200 to generate different baseband or IF signals corresponding to the frequency down-conversion of the multi-band RF received signal 1303, where each of the bands of the input multiband signal are centered around respective carrier frequencies $fc_k$, k=1 to M. In this scenario, the configuration of a cascaded receiver 1200 is configured to receive concurrently a contiguous, a noncontiguous, or multi-carrier RF signal. As described earlier the receiver 1200 may also implement energy harvesting as described herein.

Figure 14:
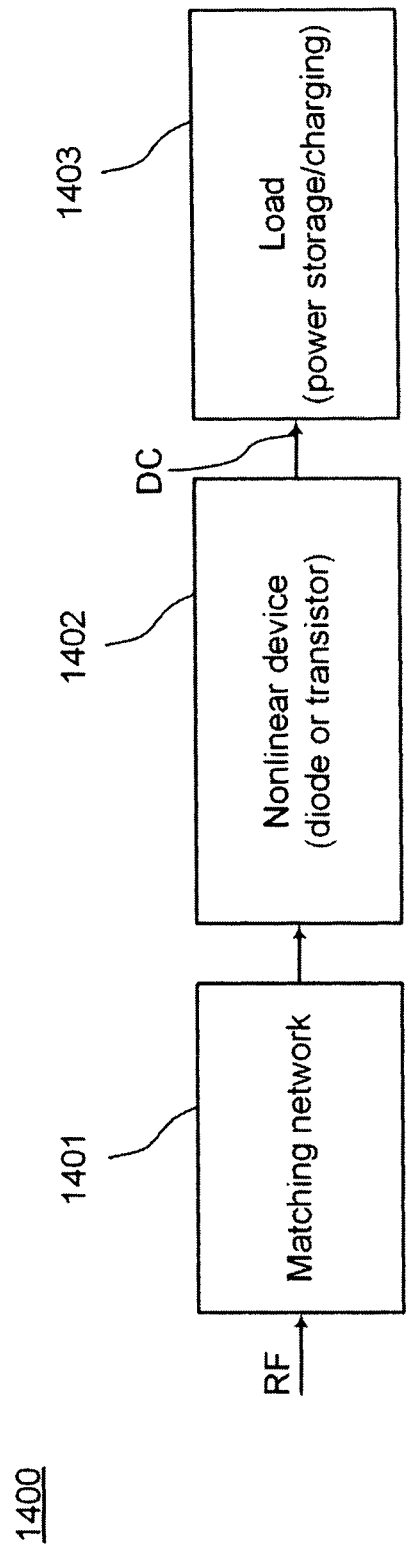
FIG. 14 shows an example implementation of an energy harvesting block for the energy harvesting receiver, according to an embodiment of the present matter.

Referring to FIG. 14 there is shown a block diagram of an energy harvesting block 1400 for the energy harvesting receiver, according to an embodiment of the present matter. The energy harvester proved RF to DC conversion. The converter 1400 includes a matching network 1401, a non-linear device 1402 for DC conversion providing a generally DC output to a load (power storage or charging). As described earlier, reflected RF energy is provided to the converter. In some instances, the matching network 1400 may be as broadband as possible, however a narrowband or multiband network may also be used particularly if a known dedicated RF power RF signal is to be received.

Performance of the complete QPS-FS receiver according to an embodiment of the present matter was evaluated with two different modulated signals in the 700 MHz RF band. The transmitted and received spectra, and the transmitted and received constellation points, respectively, for a 4-QAM (16-QAM) signal having 0.1 MHz bandwidth was evaluated. Average RF power at 700 MHz carrier frequency for both the signals during measurement was −37 dBm. Error vector magnitudes (EVM) between the transmitted ($S_{tx}[i]$) and the received ($S_{rx}[i]$) constellation points, for both the test cases were less than 4%.

It may be seen from the above that a completely passive blockers tolerant quadrature phase shift frequency selective (QPS-FS) receiver architecture is described, that is frequency selective (by selecting an appropriate switching frequency and component values) utilizing the impedance translation and harmonic recombination concepts described herein. The QPS-FS receiver is clock jitter tolerant utilizing a new approach for frequency down-conversion and quadrature demodulation using a linear and passive quadrature phase shift network in the RF signal path of the receiver and a single clock signal to operate all the switches in the receiver. In one embodiment the QPS-FS receiver eliminates the requirement of an active multi-phase clock generation circuit from the conventional passive mixer (P-M) receivers. The QPS-FS receiver may utilize a much slower clock signal source that would extend the frequency coverage of the receiver to the maximum of the clock signal source speed as opposed to a much lower frequency for the conventional N-path passive mixer (P-M) receiver. Elimination of an active multi-phase clock generation circuit from the QPS-FS receiver architecture and the reduction of operating frequency would reduce the overall power consumption of the present receiver system. Sharing of common clock signals by the switching transistors helps in reducing the effect of clock jitters on the overall receiver performance. The performance of an actual implemented receiver system using the present QPS-FS receiver architecture has been verified for the 700 MHz RF band of operation.

The invention claimed is:

1. A wireless signal receiver comprising:
two or more signal phase shifting blocks each phase shifting block having one or more input signal ports, two or more phase shifted signal output ports, and one or more reflection signal output ports;
impedance translation function blocks coupled to the two or more phase-shifted signal output ports of the respective ones of the impedance translation function blocks to generate in response to a switching signal respective band limited baseband or IF signals,
wherein a first of said two or more signal phase shifting blocks has the one or more reflection signal output ports connected to the input signal ports of a second of said two or more signal phase shifting blocks, and wherein the
signal phase shifting block generates concurrent phase shifted copies of an input signal; and
the impedance translation function block is configured to receive the phase shifted copies of the input signal and generate a down converted signal.

2. The receiver of claim 1, wherein the impedance translation function block is driven by a single clock signal of frequency determined by a desired carrier frequency.

3. The receiver of claim 2, wherein the clock signal is generated by a clock source of single frequency.

4. The receiver of claim 1, wherein the impedance translation function block includes pairs of switches operable in complimentary anti-phase mode.

5. The receiver of claim 1, wherein the down converted signals at the outputs of impedance translation function blocks are an IF or baseband signals.

6. The receiver of claim 1, wherein the phase shifted copies are distributed uniformly in phase from 0 degrees to 360 degrees.

7. The receiver of claim 1, including a signal processing block configured to receive the down converted signals from the impedance translation blocks and generate an output baseband signal.

8. The receiver of claim 1, including one or more energy harvesting blocks coupled to the phase shifting block to receive one or more in-band or out-of-band interferers in said input signal and reflected signals due to nonlinearities of the said impedance translation function blocks.

9. The receiver of claim 8, wherein the one or more energy harvesting blocks are coupled to a one or more signal reflection ports of the phase shifting block.

10. The receiver of claim 8, wherein the one or more harvesting blocks are operable concurrently with receiver decoding of information.

11. The receiver of claim 8, wherein the energy harvesting block includes a signal-converter from the input frequency of the signals to DC.

12. The receiver of claim 8, wherein the energy harvesting block operates concurrently or in a toggling mode with the reception of the said input signal.

13. The receiver of claim 1, wherein the signal phase shifting block includes one or more RF input ports, two or more phase shifted signal output ports, and one or more reflection signal output ports outputting reflected in-band and out-of-band interferer signals from said input RF signal and reflected distortions due nonlinearities of the impedance translation function blocks.

14. A receiver comprising:
two or more signal phase shifting blocks each phase shifting block having one or more input signal ports, two or more phase shifted signal output ports, and one or more reflection signal output ports;
impedance translation function blocks coupled to the two or more phase-shifted signal output ports of the respective ones of the impedance translation function blocks to generate in response to a switching signal respective band limited baseband or IF signals,
wherein a first of said two or more signal phase shifting blocks has the one or more reflection signal output ports connected to the input signal ports of a second of said two or more signal phase shifting blocks.

15. The receiver of claim 14, including an energy harvesting block coupled to the reflection output ports of a last of the phase shifting block.

16. The receiver of claim 14, including one or more energy harvesting blocks coupled to the last phase shifting block to receive one or more in-band or out-of-band interferers in said input signal and any reflected signals due to nonlinearities of the said impedance translation function blocks.

17. The receiver of claim 14, is further configured so as to receive a single carrier modulated signal
    wherein each of the said band limited baseband or IF signals corresponding to the frequency down-converted version of a sub-band of the said received single carrier modulated signal
    wherein said band limited baseband or IF signals are further processed to obtain one broader-band baseband or IF signals corresponding to the frequency down-converted version of the said received single carrier modulated signal such that receiver has an enhanced selectivity and sharper out-of-band frequency suppression.

18. The receiver of claim 14, is further configured so as to receive a multi-carrier contiguous or non-contiguous carrier aggregated modulated signal
    wherein each of the said band limited baseband or IF signals corresponding to the frequency down-converted version of one full band or a sub-band of one full band of the said received multi-carrier contiguous or non-contiguous carrier aggregated modulated signal
    wherein said band limited baseband or IF signals are further processed to obtain different baseband or IF signals each corresponding to the frequency down-converted version of one full band of the said received multi-carrier contiguous or non-contiguous carrier aggregated modulated signal such that receiver can operate to receive the different bands concurrently.

19. A method for a receiver comprising:
    inputting an RF signal to a signal phase shifting block to generate concurrent phase shifted copies of the input signal; and
    operating an impedance translation function block to receive the phase shifted copies of the input signal and generate a down converted signal wherein the receiver includes two or more of the signal phase shifting blocks each having one or more input signal ports, two or more phase shifted signal output ports, and one or more reflection signal output ports;
    impedance translation function blocks coupled to the two or more phase-shifted signal output ports of the respective ones of the impedance translation function blocks to generate in response to a switching signal respective band limited baseband or IF signals, and
    wherein a first of said two or more signal phase shifting blocks has the one or more reflection signal output ports connected to the input signal ports of a second of said two or more signal phase shifting blocks.

* * * * *